(12) United States Patent
Nose et al.

(10) Patent No.: US 8,355,884 B2
(45) Date of Patent: Jan. 15, 2013

(54) SIGNAL QUALITY MEASUREMENT DEVICE, SPECTRUM MEASUREMENT CIRCUIT, AND PROGRAM

(75) Inventors: Koichi Nose, Tokyo (JP); Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 729 days.

(21) Appl. No.: 12/522,243

(22) PCT Filed: Dec. 18, 2007

(86) PCT No.: PCT/JP2007/074329
§ 371 (c)(1),
(2), (4) Date: Jul. 6, 2009

(87) PCT Pub. No.: WO2008/081713
PCT Pub. Date: Jul. 10, 2008

(65) Prior Publication Data
US 2010/0094577 A1  Apr. 15, 2010

(30) Foreign Application Priority Data

Jan. 5, 2007 (JP) .................................. 2007-000567
Jun. 1, 2007 (JP) .................................. 2007-146818

(51) Int. Cl.
*G01R 23/16* (2006.01)
(52) U.S. Cl. ........................................................ 702/76
(58) Field of Classification Search ....... 702/7, 189–191
See application file for complete search history.

(56) References Cited

U.S. PATENT DOCUMENTS 6,130,577 A * 10/2000 Tamba et al. ................. 329/304
6,985,020 B2 * 1/2006 Zhou ............................ 327/317

FOREIGN PATENT DOCUMENTS

| JP | 1993312858 A | 11/1993 |
| JP | 2000009768 A | 1/2000 |
| JP | 2000111587 A | 4/2000 |
| JP | 2002196025 A | 7/2002 |
| JP | 2005501267 A | 1/2005 |
| JP | 2006504303 A | 2/2005 |
| JP | 2005338033 A | 12/2005 |
| JP | 2006186153 A | 5/2006 |
| JP | 2006250586 A | 9/2006 |

OTHER PUBLICATIONS

International Search Report for PCT/JP2007/074329 mailed Apr. 8, 2008.
A. P. Jose et al., "On-Chip Spectrum Analyzer for Analog Built-in Self Test", Proceedings of the 23rd IEEE VLSI Test Symposium, 2005.
M. Takamiya, et al., "A Sampling Oscilloscope Macro toward Feedback Physical Design Methodology", Symp VLSI Circuits Dig. 18, p. 240-243.
E. Alon, et al., "Circuits and Techniques for High-Resolution Measurement of On-Chip Power Supply Noise", IEEE Journal of Solid-State Circuits, vol. 40, No. 4, Apr. 2005, p. 820-828.

* cited by examiner

*Primary Examiner* — Mohamed Charioui

(57) ABSTRACT

Spectrum measurement circuit (101) includes: N-(where N is integer equal or greater than 2) phase clock generation circuit (304) for supplying phase-modulated signals in which the phase of a clock signal is shifted by a phase modulation amount each time the settings of the phase modulation amount are switched; mixer circuit (303) for taking the product of a measured signal supplied from a transmitter and the phase-modulated signals supplied from N-phase clock generation circuit (304); average value output circuit (305) for supplying an average voltage value of the output signal of mixer circuit (303); memory (307) for storing the average voltage value supplied from average value output circuit (305) for each phase modulation amount of N-phase clock generation circuit (304); and arithmetic unit (308) for using the average voltage value for each phase modulation amount of N-phase clock generation circuit (304) to calculate the signal strength of the measured signal.

15 Claims, 12 Drawing Sheets

SIGNAL QUALITY MEASUREMENT DEVICE, SPECTRUM MEASUREMENT CIRCUIT, AND PROGRAM

This application is the National Phase of PCT/JP2007/074329, filed Dec. 18, 2007, which claims priority based on Japanese Patent Application No. 2007-000567 the application of which was submitted on Jan. 5, 2007 and Japanese Patent Application No. 2007-146818 the application of which was submitted on Jun. 1, 2007 and incorporates all disclosures of these applications.

TECHNICAL FIELD

The present invention relates to technology for measuring the signal quality of LSI (integrated circuits).

BACKGROUND ART

In recent years, the operating frequency of LSI has improved and there is consequently a growing demand for radio (RF) LSI that use the GHz band. As a result, in the testing of radio LSI, the measurement of the signal quality of radio LSI, and the selection and correction of radio LSI are of increasing importance.

In the related testing of radio LSI, a method is employed of using a digital tester to carry out parallel measurement of a large number of radio LSI on a wafer. This method has the advantages of low cost and short measurement time, but has the drawback that only digital signals of a narrow band (approximately several 100 MHz or less) can be measured.

A method can be considered of using a dedicated measurement device such as a spectrum analyzer and a dedicated probing device that is compatible with high-speed (GHz) analog I/O to measure radio LSI one at a time, but this method has the drawbacks of increased equipment cost and lengthy measurement time.

As a result, there has recently been a growing demand for lower costs and higher speeds in the testing of radio LSI.

For example, in the testing of RF receivers, the selection and correction of RF receivers is carried out by applying a faint signal of the −100 dBm level and that is a high-speed carrier signal to RF receivers and measuring the error rate.

A related signal quality measurement device directed to these purposes is of a configuration in which a signal is applied as input to RF receiver 1203 by way of arbitrary waveform generator 1201 and waveform attenuator 1202 that are outside the chip, as shown in FIG. 1. However, this device suffers from the drawbacks of excessive measurement time and prohibitive cost.

To solve these problems, a configuration has been proposed by which on-chip waveform attenuator 1303 is incorporated as shown in FIG. 2, the output signal of RF transmitter 1301 being applied to RF receiver 1302 after having been attenuated 70-100 dBm by passage through waveform attenuator 1303. Testing that is carried out in this configuration is referred to as transmitter-receiver end-to-end testing. By means of this configuration, a signal of a suitable strength can be applied to RF receiver 10302 from on-chip RF transmitter 1301 instead of giving a signal to RF receiver 10302 from outside the chip, whereby a shortening of the measurement time and a reduction of the device cost can be achieved.

However, the trend toward micro-processing of RF chips in recent years, and in addition, the variation among elements that are used in waveform attenuators, have resulted in an increase in the variation in signal strength between chips. As a result, guaranteeing measurement accuracy in a transmitter-receiver end-to-end test, or in other words, measuring the strength of a signal that is applied as input to an RF receiver and appropriate setting of the strength of a signal that is supplied from an RF transmitter, have become problematic. As a result, there is demand for a technology that enables measurement of the strength of a signal that is applied as input to an RF receiver or the characteristics of a waveform attenuator by means of, for example, a highly accurate and low-cost off-chip measurement device such as a digital tester.

In the testing of an RF transmitter, it is further important to observe whether the strength of the output signal of the RF transmitter that has carrier frequency $f_0$ satisfies specifications.

However, a harmonic component $K*f_0$ (K=2, 3, 4, . . . ) exists as the waveform distortion (the waveform difference from a single-frequency sine wave) component in the signal waveform of the output signal of an RF transmitter. Because it is established by law that the signal strength of the harmonic component must be no greater than a fixed value, measurement is essential to determine whether an abnormal harmonic component is being supplied. Further, the move toward micro-processing of RF chips in recent years, and in addition, the incorporation of on-chip band-elimination filters has resulted in an increase in the variation in the signal strength of the harmonic component between RF chips.

As a result, it has become necessary to conduct a signal strength spectrum test for measuring the frequency distribution of signal strength (spectrum) for each radio LSI.

A related signal quality measurement device is provided with a spectrum measurement circuit for measuring the signal strength of a radio LSI and converting the measured value to a DC voltage value that can be measured in a conventional test environment.

As related spectrum measurement circuits, the following three circuits have been proposed:

As the first example of a related spectrum measurement circuit, Non-Patent Document 1 discloses a spectrum measurement circuit having a configuration composed of LNA (Low-Noise Amplifier) 1401, mixer 1402, band-pass filter 1403, and digital-analog converter 1404, as shown in FIG. 3. This configuration is substantially equivalent to the configuration of a Low-IF RF receiver.

However, in the case of the first example, the use of a multiplicity of analog circuits such as band-pass filter 1403 or LNA 1401 raises the problem of an increase in area and design complexity. Still further, the problem exists that, when the frequency of the signal that is injected to mixer 1402 is made $f_0$ for the measurement of the carrier frequency $f_0$ component of the measured signal and when a harmonic component $K*f_0$ exists in the measured signal, the measurement result changes according to the signal strength of the harmonic component even when the signal strength of the carrier frequency component is fixed.

Here, an anti-aliasing filter must be added to the input section as in a typical RF receiver. However, the addition of an anti-aliasing filter raises the problem of increasing the area overhead. Still further, when measuring different frequency components, the filter characteristics of the anti-aliasing filter must be changed for each frequency component, raising the problem of an increase in area due to the addition of the capability to alter filter characteristics.

As the second example of a related spectrum measurement circuit, Non-Patent Document 2 discloses a spectrum measurement circuit that uses a voltage comparison circuit to measure signal waveform and diverts the measurement result for spectrum measurement. However, according to sampling theory, measurement of the signal strength of a quintic harmonic ($5f_0$) component requires a measurement device having a resolution of $10f_0$ or more, which is at least two times the harmonic component. The problems are therefore raised that measurement time is increased by the increase in measurement points and that the area and design complexity are increased by the need for a broadband comparator circuit.

As the third example of a related spectrum measurement circuit, Non-Patent Document 3 discloses a spectrum measurement circuit for finding autocorrelation. An outline of the operations of the third example is shown in FIG. 4.

In the third example, first and second measurement devices are used to measure the voltage of the measured signal. At this time, the timing of the measurement of the voltage of the measured signal in the first and second measurement devices is shifted by exactly $t_0$ to measure the frequency $f_0$ (=period $t_0$) component. After the correlation coefficient R(t)=v(Ti)*v(Ti+$t_0$) of each of the measurement results (v(Ti), v(Ti+$t_0$)) has been calculated, a Fourier transform is used to obtain the signal strength spectrum.

However, as shown in FIG. 5 in the case of the third example, the autocorrelation coefficients R(τ) that are measured at the time difference $t_0$ are all the same for the signals: $f_0$ component, $2f_0$ component, $3f_0$ component, . . . of the measured signals at the time of measuring frequency $f_0$ (=period $t_0$). The problem therefore arises that the signal strengths of the harmonic component and frequency $f_0$ component cannot be discriminated at the time of measurement of frequency $f_0$ (i.e., t=$t_0$). There are the additional problems of an increase in the measurement time because an autocorrelation function must be found using the results of all phase differences, and of an increase in the design complexity due to the need for a device for generating random phases for measuring at all phase differences.

There are configurations that use a lock-in amplifier as a spectrum measurement circuit that realizes measurement of the harmonic component by means of a simple configuration of a limited area. In such configurations, an input signal switching operation is carried out in accordance with the pulse wave of frequency $f_0$, and upon smoothing of the switch output signal by a filter having a sufficiently large time constant, i.e., after a voltage-averaging process, the switch output signal is converted to a DC voltage value that accords with the strength of the frequency $f_0$ component. Repeatedly carrying out this process with each conversion of the pulse wave frequency enables measurement of the signal strength spectrum.

FIG. 6 shows the configuration of the fourth example of a related spectrum measurement circuit that uses a lock-in amplifier. Operation of the spectrum measurement circuit shown in FIG. 6 is next described using the timing chart shown in FIG. 7. Here, explanation regards a case in which the frequency component of measured signal 1701 is $f_0$, the amplitude is A, the phase is θ, and the DC offset is B.

Measured signal 1701 passes through switch 1703 that is controlled by clock signal 1702 and is applied as input to average value output circuit 1705, whereupon the average voltage Vave of measured signal 1701 during the interval that switch 1703 is ON is supplied as output from average value output circuit 1705. Here, Vave is (2A cos θ/π)+B.

The use of switch 1703 and average value output circuit 1705 in this way enables the conversion of the signal waveform to a DC voltage (a voltage that does not fluctuate with time) that is proportional to the signal strength (amplitude A). However, the problems arise that, by only the measurement result of Vave, the value of DC voltage shifts in accordance with the phase θ of measured signal 1701, and when the offset voltage B is included in measured signal 1701, this offset voltage B is reflected without alteration in the value of the DC voltage and cannot be discriminated from signal amplitude A.

Patent Document 1 discloses a method as a technology for solving the problem in which the measurement results fluctuate in accordance with the offset voltage and phase of the measured signal. As shown in FIG. 8, this method prepares switched capacitor circuits 1902 that, fetching electrical charges discretely from measured signal f(t) 1902 at the output timing of control circuits 1901, can change the electrical charge quantity in accordance with the values of addition signal ADD and subtraction signal SUB. As shown in FIG. 9, the operation timing of control circuits 1901 employs values obtained by approximating by multiple levels the amplitude of sine wave signal 2001 of an analytic frequency in first switched capacitor circuit 1903 and values obtained by approximating by multiple levels the amplitude of the cosine wave signal of the analytic frequency in second switched capacitor circuit 1903. Electrical charge is discretely fetched from the input signal by switched capacitor circuit 1903 at the number of fetch times per unit time (a multiple m of the frequency of control circuits 1901 (where m=1, 2, 3)) that accords with the amplitude of these multiple values, and this fetch value is squared to take the square root after addition to obtain the power spectrum of the analytic frequency components contained in the input signal, i.e., output that is free of influence from both phase angles. This method obtains a result that does not depend on the value of the phase θ or offset voltage B of measured signal f(t) 1902.

In the above-described methods, however, a pulse wave must be generated that is a multiple of the frequency of the measured signal to operate the switched capacitor circuits, and in the measurement of the spectrum of an RF signal for which the frequency of the measured signal exceeds 1 GHz, the switch operation of the pulse wave generation circuit or switched capacitor circuit must be implemented at over 4 GHz, a requirement that is problematic from the standpoint of design. Still further, in the measurement of the harmonics (an integer multiple of 1 GHz) of an RF signal, the switch operation of a pulse-wave generation circuit or switched capacitor circuit is at a speed that is an integer multiple of 4 GHz, a requirement that presents even greater problems for design. In addition, a capacitor circuit that is used in a switched capacitor circuit that allows addition/subtraction circuits must be non-polar (electrical charge does not change according to the voltage of the two poles), but typical gate capacitance has polarity and is therefore difficult to apply. Still further, in the method of approximating a sine wave signal (a combination of multiples m of the frequency of the control circuit (where m=1, 2, 3)), there is the additional problem that, because tertiary/quintic harmonic components cannot be completely eliminated from an approximated sine wave signal component, the measurement results fluctuate according to these values when a tertiary/quintic signal is contained in the measured signal.

As described hereinabove, the related signal quality measurement devices entail the following problems:

A problem in signal strength spectrum testing is that the measurement results of the signal strength of a measured signal are influenced by the odd-order harmonic components of the measured signal. A further problem is the difficulty of simultaneously preventing fluctuation caused by the phase or offset voltage of the measured signal while enabling measurement of a measured signal in a high band.

A problem in transmitter-receiver end-to-end testing is that the strength of the input signal of the receiver and the characteristics of a waveform attenuator cannot be measured with high precision or at low cost.

Patent Document 1: JP-A-2000-9768
Non-Patent Document 1: VLSI Test Symposium, 2005. Proceedings. 23$^{rd}$ IEEE pp. 131-136, May 2005.
Non-Patent Document 2: Symp. VLSI Circuits Digest No. 18, pp. 240-243
Non-Patent Document 3: IEEE Journal of Solid-State Circuits, Vol. 40, No. 4, April 2005, p. 820.

DISCLOSURE OF THE INVENTION

It is the first object of the present invention to provide a technology in radio LSI signal strength spectrum testing that enables measurement of the signal strength of a measured signal without using a clock having higher frequency than the measured signal, and further, that, by using results of measurement by shifting the clock phase and carrying out an arithmetic process, enables elimination of the influence of the phase or odd-order harmonic components of a measured signal.

It is the second object of the present invention to provide a technology in radio LSI transmitter-receiver end-to-end testing that enables measurement of the strength of an input signal of a receiver or the characteristics of a waveform attenuator by an external measurement device that is both highly accurate and low-cost.

To achieve that above-described objects, the present invention is applied to a signal quality measurement device that includes: a transmitter and a receiver that are test objects; a waveform attenuator for, after having attenuated the measured signal that was supplied as output from the transmitter, applying the measured signal as input to the receiver; and a spectrum measurement circuit for measuring the signal strength of the measured signal that was supplied as output from the transmitter.

As a characteristic point of the present invention, the spectrum measurement circuit includes: an N- (where N is an integer equal to or greater than 2) phase clock generation circuit for supplying phase-modulated signals obtained by shifting the phase of a clock signal by exactly a phase modulation amount each time the setting of the phase modulation amount is switched; a mixer circuit for taking the product of the measured signal that was supplied from the transmitter and the phase-modulated signals supplied from the N-phase clock generation circuit; an average value output circuit for supplying the average voltage value of the output signal of the mixer circuit; a memory for storing average voltage values supplied from the average value output circuit for each phase modulation amount of the N-phase clock generation circuit; and an arithmetic unit for using the average voltage value that is stored in memory for each phase modulation amount of the N-phase clock generation circuit to calculate the signal strength of the measured signal.

According to this configuration, using not only the average voltage value of the average value output circuit when a clock signal is used but also the average voltage value of the average value output circuit when a phase-modulated signal obtained by shifting the phase of the clock signal is used, can solve the problem that could not be solved by using only the average voltage value when a clock signal is used, i.e., can eliminate the influence of the phase or odd-order harmonic components of the measured signal from the measurement results of the signal strength of the measured signal.

Still further, the frequency of the clock signal that is used in this configuration may be identical to the frequency of the spectrum component that is to be measured or may be $(1/m)^{th}$ (where m is an integer) of the frequency of the spectrum component that is to be measured, whereby the conventional necessity of generating a pulse wave that is a multiple of the frequency of the measured signal and carrying out a switching operation is eliminated and design is facilitated.

Another characteristic point of the present invention is that the waveform attenuator includes: first and second terminals to which voltage is applied from the outside; a first resistor having one end connected to the first terminal; a second resistor having one end connected to the second terminal and the other end connected to the other end of the first resistor; and a third resistor having one end connected to a connection node of the first and second resistors and the other end grounded.

According to this configuration, DC voltage is applied to the first and second terminals of the waveform attenuator, and by reading the current value at this time from outside the chip, the resistance values of the first to third resistors that make up the waveform attenuator can be measured with high accuracy.

Accordingly, the strength of the input signal of the receiver and the characteristics of the waveform attenuator can be measured by a measurement device such as a high-precision and low-cost off-chip digital tester. In addition, the signal strength of a measured signal that is measured by means of the spectrum measurement circuit can be read from outside the chip.

BEST MODE FOR CARRYING OUT THE INVENTION

Figure 10:
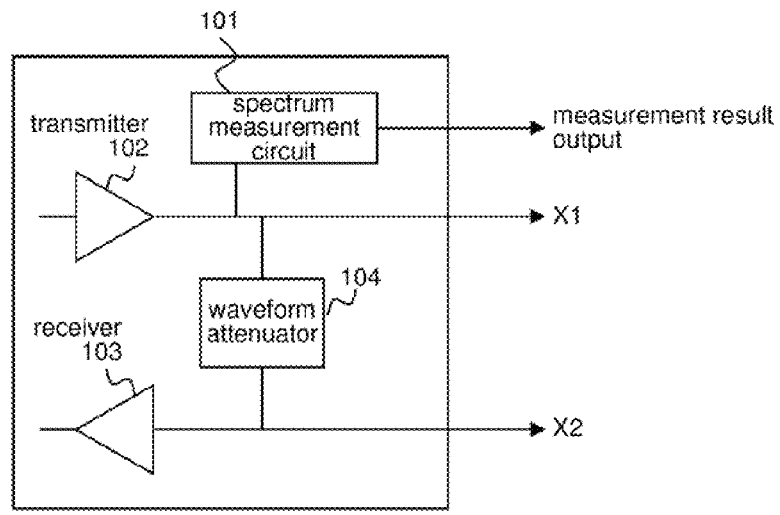
FIG. 10 is a block diagram showing the overall configuration of the signal quality measurement devices of the first to third exemplary embodiments of the present invention.

Explanation next regards the best mode of carrying out the present invention with reference to the accompanying figures.
First Exemplary Embodiment FIG. 10 is a block diagram showing the overall configuration of the signal quality measurement device of the first exemplary embodiment of the present invention. The overall configurations of the signal quality measurement devices of the second and third exemplary embodiments described hereinbelow are similar to FIG. 10.

As shown in FIG. 10, the signal quality measurement device of the present exemplary embodiment is of a configuration that includes on the same chip: spectrum measurement circuit 101, RF transmitter 102, RF receiver 103, and waveform attenuator 104.

In the signal quality measurement device of the present exemplary embodiment, the output signal of RF transmitter 102 is applied as input to RF receiver 103 after having been subjected to 70-100 dBm attenuation by passage through waveform attenuator 104 in transmitter-receiver end-to-end testing and signal strength spectrum testing. In other words, instead of applying a signal to RF receiver 103 from the outside, a signal is applied from RF transmitter 102 on the chip. In addition, the signal strength of the output signal of RF transmitter 102 is measured in spectrum measurement circuit 101 in order to set the signal strength of the harmonic component of the input signal of RF receiver 103 to no greater than a fixed value.

Figure 11:
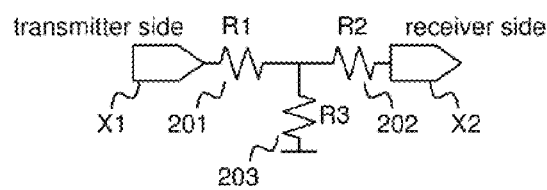
FIG. 11 is a block diagram showing the configuration of a waveform attenuator according to the first to fourth exemplary embodiments of the present invention.

FIG. 11 is a block diagram showing the configuration of waveform attenuator 104 according to the first exemplary embodiment of the present invention. The configuration of waveform attenuator 104 according to the second to fourth exemplary embodiments described hereinbelow is similar to that of FIG. 11.

As shown in FIG. 11, waveform attenuator 104 includes: first and second terminals X1 and X2 to which voltage is applied from the outside; resistor 201 having one end connected to first terminal X1; resistor 202 having one end connected to second terminal X2 and the other end connected to the other end of resistor 201; and resistor 203 having one end connected to the connection node of resistors 201 and 202 and the other end grounded. The resistance values of resistors 201-203 are R1-R3, respectively.

A method of measuring resistance values R1-R3 of resistors 201-203 of waveform attenuator 104 is next described.

Voltage V1 is first applied to first terminal X1, and second terminal X2 is placed in a high impedance state. Assuming the current is I1 at this time, V1=I1*(R1+R3).

Next, voltage V2 is applied to second terminal X2, and first terminal X1 is placed in a high-impedance state. Assuming that the current is I2 at this time, V2=I2*(R2+R3).

Voltage V3 is then applied to first terminal X1, and second terminal X2 is placed in a grounded state. Assuming that the current is I3 at this time, V3=I3*(R1+(R2*R3)/(R2+R3)).

As a result, because R1-R3 can be found based on the above three formulas, the characteristics of waveform attenuator 104 can be measured with high accuracy.

Figure 12:
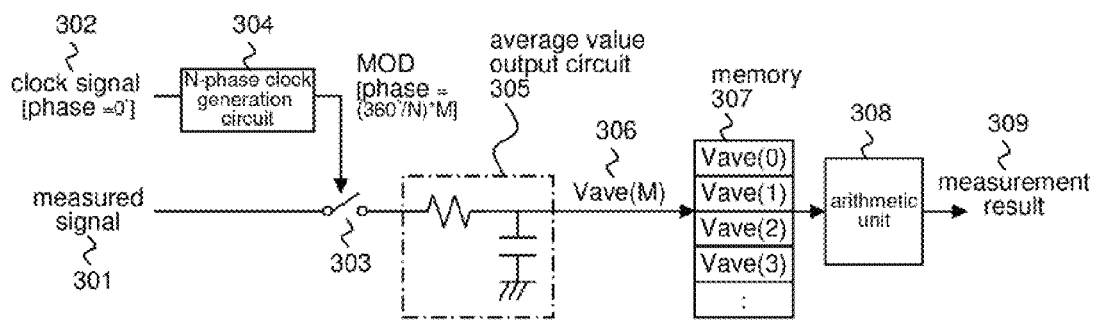
FIG. 12 is a block diagram showing the configuration of the spectrum measurement circuit according to the first exemplary embodiment of the present invention.

FIG. 12 is a block diagram showing the configuration of spectrum measurement circuit 101 according to the first exemplary embodiment of the present invention.

As shown in FIG. 12, spectrum measurement circuit 101 according to the present exemplary embodiment includes: switch 303, N-phase clock generation circuit 304 (where N=2, 3, . . . and is determined at the design stage), average value output circuit 305, memory 307, and arithmetic unit 308.

Figure 13:
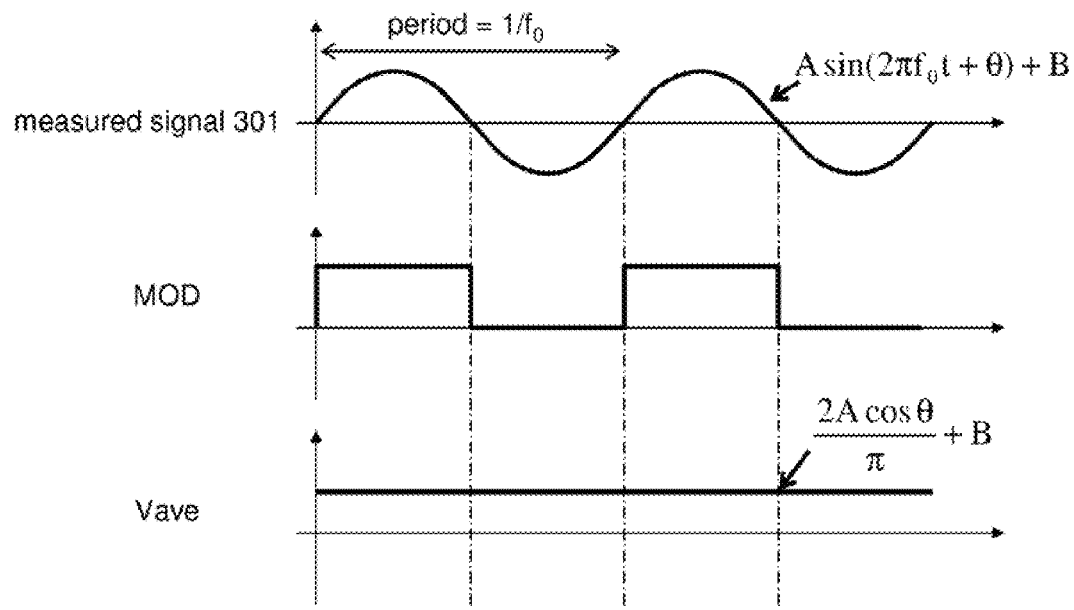
FIG. 13 is a timing chart for explaining the basic operations of the spectrum measurement circuit according to the first exemplary embodiment of the present invention.

Here, the operation of spectrum measurement circuit 101 shown in FIG. 12 is explained using the timing chart of FIG. 13.

First, explanation is given regarding the operations of spectrum measurement circuit 101 when measured signal 301 is a sine wave of frequency $f_0$, the amplitude is A, the phase θ, and the DC offset is B.

Figure 14:
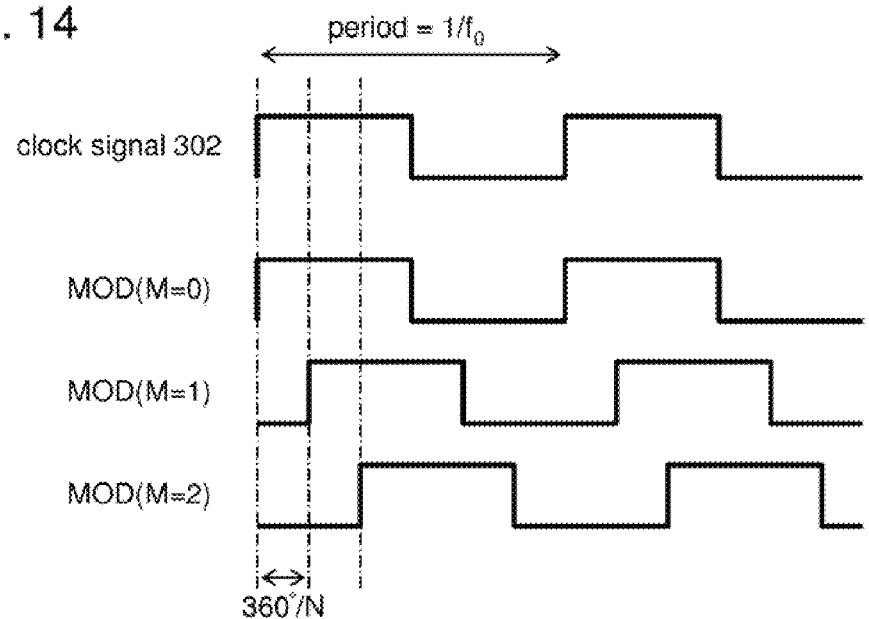
FIG. 14 is a timing chart for explaining the phase-modulated signal that is used in the spectrum measurement circuit according to the first exemplary embodiment of the present invention when the measured signal is a waveform that does not include frequency components other than the carrier frequency component.

In this case, to measure the signal strength (signal amplitude) of the carrier frequency $f_0$ component of measured signal 301, the frequency of clock signal 302 is set to $f_0$. N-phase clock generation circuit 304 supplies phase-modulated signals MOD having phase obtained by shifting the phase of clock signal 302 by a phase modulation amount (360°/N)*M (where M=0, 1, . . . , (N−1) and can be set from the outside). FIG. 14 shows the phase relation between phase-modulated signal MOD that is supplied from N-phase clock generation circuit 304 and clock signal 302.

Phase-modulated signals MOD are signals for controlling the ON/OFF state of switch 303. Only during the interval in which phase-modulated signal MOD is high level does switch 303 turn ON, allowing measured signal 301 to pass through switch 303.

When measured signal 301 passes through switch 303 and is applied as input to average value output circuit 305, the average voltage Vave of signal 306 that is supplied from average value output circuit 305 is the average voltage value of measured signal 301 during the time interval in which switch 303 was ON. Vave is stored in memory 307 for each value of M that was used in the control of N-phase clock generation circuit 304.

Arithmetic unit 308 then measures the signal strength of the frequency $f_0$ component of measured signal 301 based on the result of measuring Vave that is stored in memory 307, and supplies the DC voltage that accords with the measured signal strength as measurement result 309.

Figure 1:
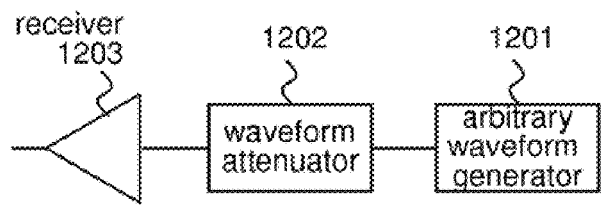
FIG. 1 is a block diagram showing an example of the configuration of a related signal quality measurement device.
Figure 2:
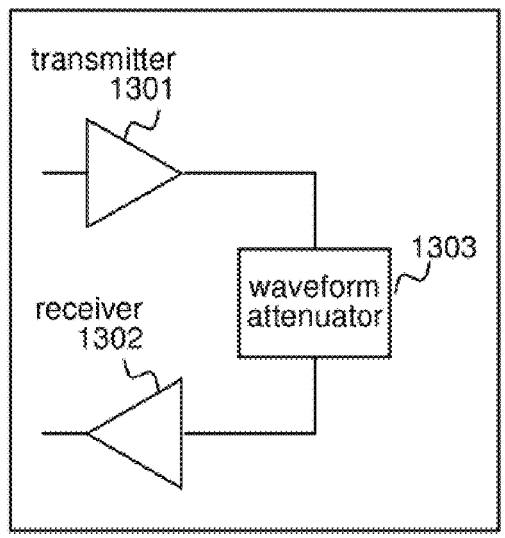
FIG. 2 is a block diagram showing another example of the configuration of a related signal quality measurement device.
Figure 3:
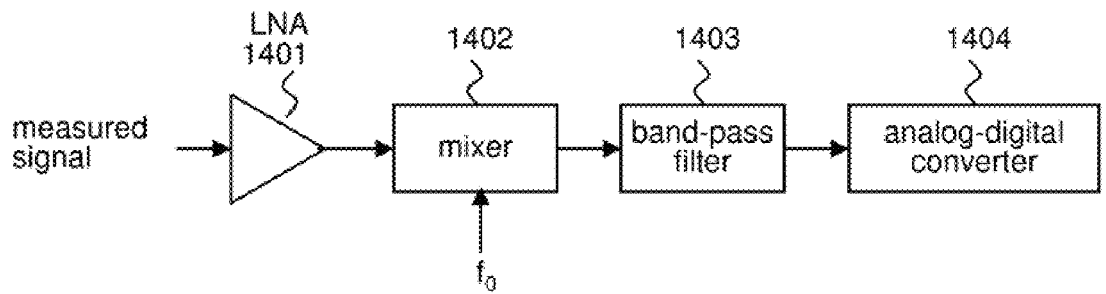
FIG. 3 is a block diagram showing the configuration of the first example of a related spectrum measurement circuit.
Figure 4:
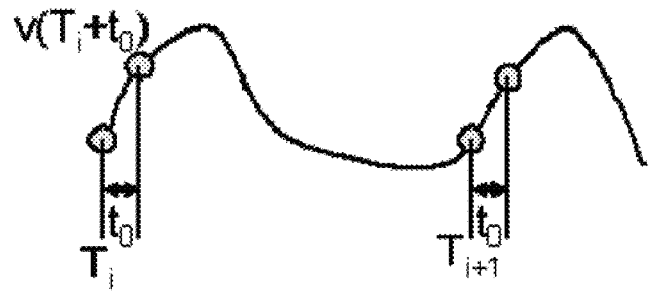
FIG. 4 shows the operation of a third example of a related spectrum measurement circuit.
Figure 5:
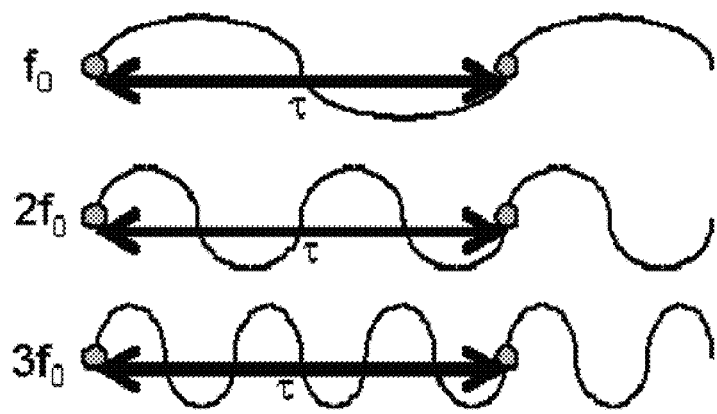
FIG. 5 is a timing chart for explaining the problems of the third example of a related spectrum measurement circuit.
Figure 6:
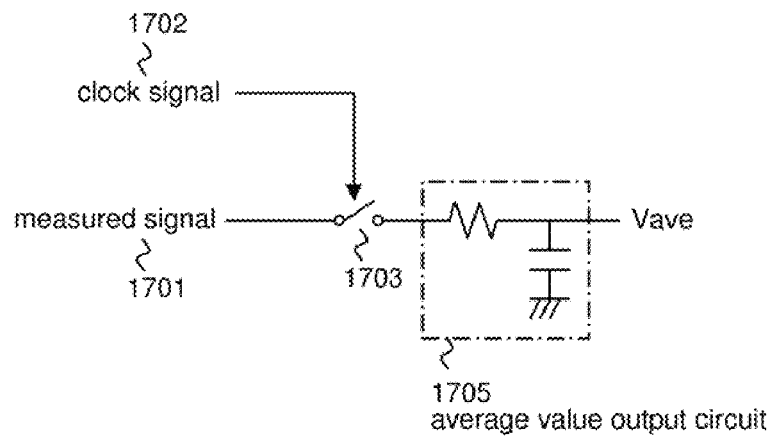
FIG. 6 is a block diagram showing the configuration of a fourth example of a related spectrum measurement circuit.
Figure 7:
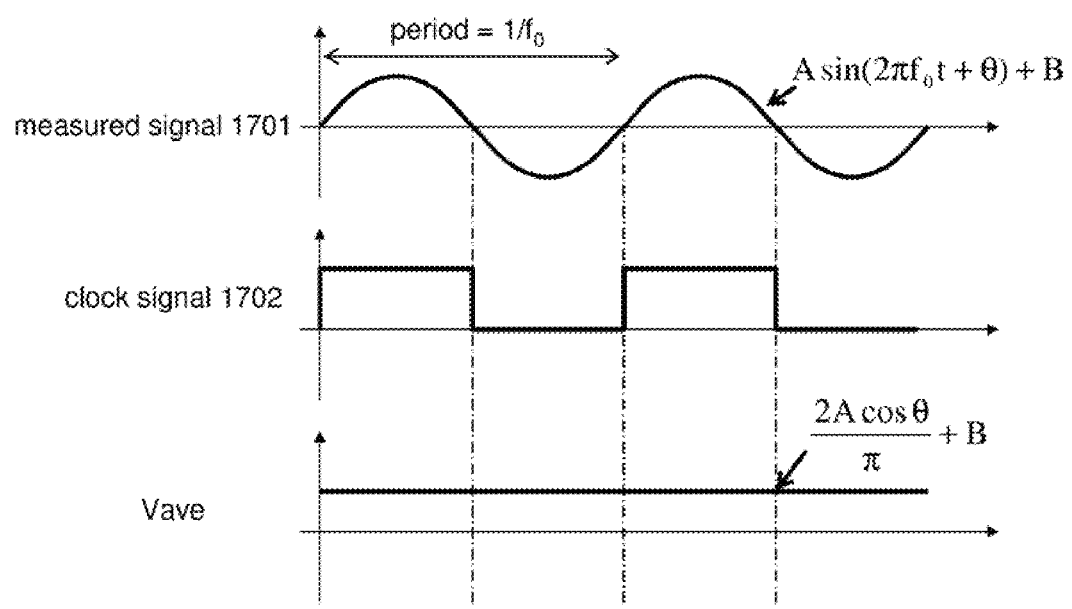
FIG. 7 is a timing chart for explaining the basic operations of the fourth example of a related spectrum measurement circuit.
Figure 8:
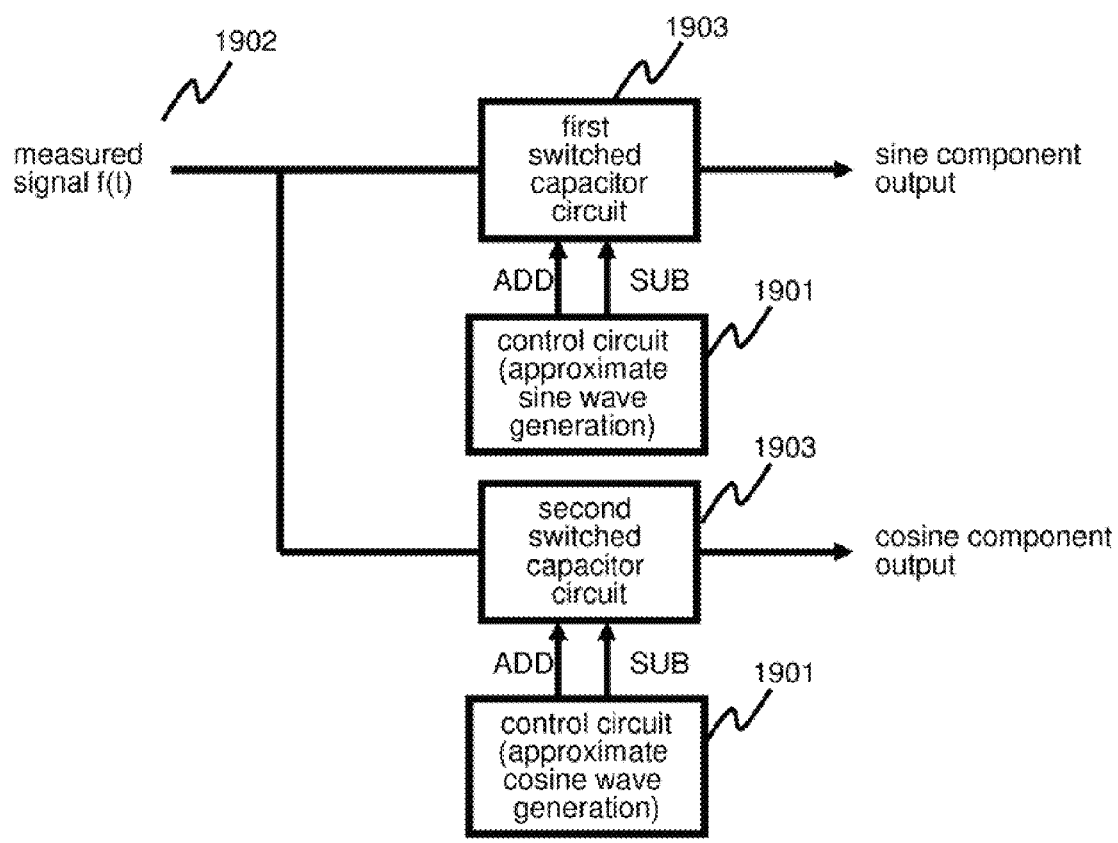
FIG. 8 is a block diagram showing the configuration of the fifth example of a related spectrum measurement circuit.
Figure 9:
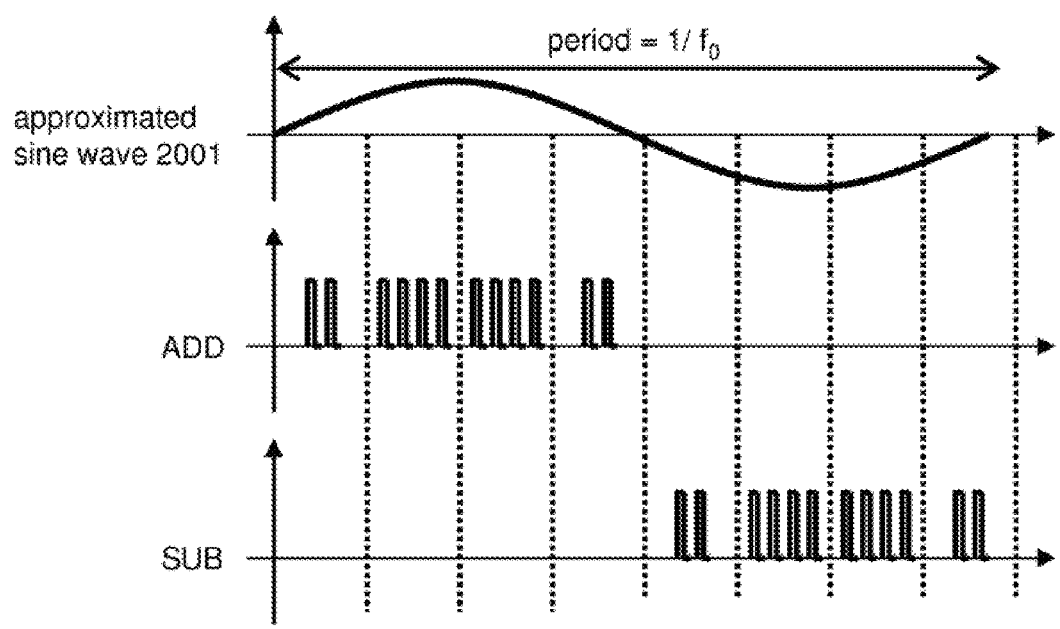
FIG. 9 is a timing chart for explaining the basic operations of the fifth example of a related spectrum measurement circuit.

As an example, when N is fixed to 1 and M is fixed to 0, i.e., when clock signal 302 and phase-modulated signal MOD are identical, the configuration is substantially identical to the spectrum measurement circuit shown in FIG. 6 as the related art. However, when the signal strength is measured by only the measurement results of Vave when M is 0, the problem arises that these measurement results 309 shift according to phase θ of measured signal 301, and when offset voltage B is included in measured signal 301, the problem arises that this offset voltage B is reflected without change in the measurement results 309 and cannot be discriminated from results that reflect amplitude A of measured signal 209.

Figure 15:
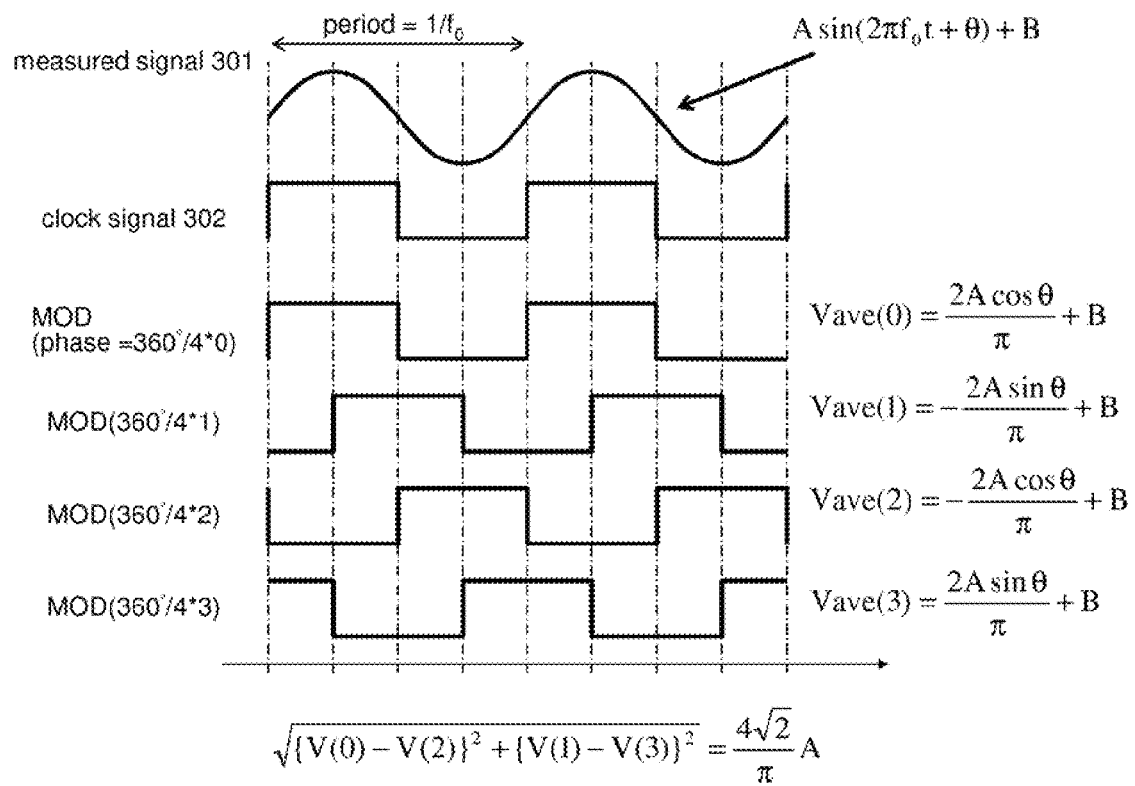
FIG. 15 is a timing chart for explaining the process of measuring the signal strength of a measured signal by using the phase-modulated signal shown in FIG. 13 in the spectrum measurement circuit according to the first exemplary embodiment of the present invention.

In order to solve the above-described problems, the measurement of Vave is carried out by setting N to 4 and successively switching the value of M from 0 to 3 and then measuring signal strength in arithmetic unit 308 based on these measurement results. This measurement method is next explained using the timing chart of FIG. 15.

First, M is set to 0 in N-phase clock generation circuit 304, whereupon the phase-modulated signal MOD supplied as output from N-phase clock generation circuit 304 becomes a signal having the same frequency and same phase as clock signal 302. If Vave at this time is taken as Vave(0), then Vave(0)=(2A cos θ/π)+B as shown in FIG. 13. This value is stored in memory 307.

When M is next switched to 1, phase-modulated signal MOD becomes a signal having the same frequency as clock signal 302 but having a phase that is delayed by 90° from clock signal 302. If Vave at this time is taken as Vave(1), then Vave(1)=(−2A sin θ/π)+B. This value is stored in a location different from the location in which Vave(0) is stored in memory 307.

Similarly, Vave(2) when M is switched to 2 and Vave(3) when M is switched to 3 are successively stored in memory 307. At this time, Vave(2)=(−2A cos θ/π)+B and Vave(3)=(2A sin θ/π)+B.

Arithmetic unit 308 then uses Vave(0)-Vave(3) to carry out the operation of the following formula 1 to measure the signal strength of the frequency $f_0$ component of measured signal 301. As a result, these measurement results 309 are proportional only to amplitude A and thus become results that do not depend on the value of and B.

$$\sqrt{\{V(0) - V(2)\}^2 + \{V(1) - V(3)\}^2} = \frac{4\sqrt{2}}{\pi} A \quad \text{Formula 1}$$

A solution is thus provided for the problem that could not be solved when only the measurement result of Vave, when M is 0, is used as in the related art.

When values obtained by formula 1 are substituted as the values of Vave(0) Vave(3), the values of θ and B can also be found.

In addition, the costs required for testing radio LSI can be reduced because a DC signal that can be measured even in a conventional tester environment is supplied as measurement result 309.

The operations of formula 1 can also be carried out by a measurement device that is outside the chip. In this case, arithmetic unit 308 is not required in the chip and the circuit configuration can be made simpler to achieve a greater reduction of area and easier design.

Further, in cases other than when N=4, the measurement of signal strength is possible when N is any value of 4 or greater.

As a first example, a case is next described in which N=6.

Measurement of Vave is carried out when the value of M is successively switched from 0 to 5, and measurement of the signal strength is carried out in arithmetic unit 308 based on these measurement results. This measurement method is described below using the timing chart of FIG. 16.

Figure 16:
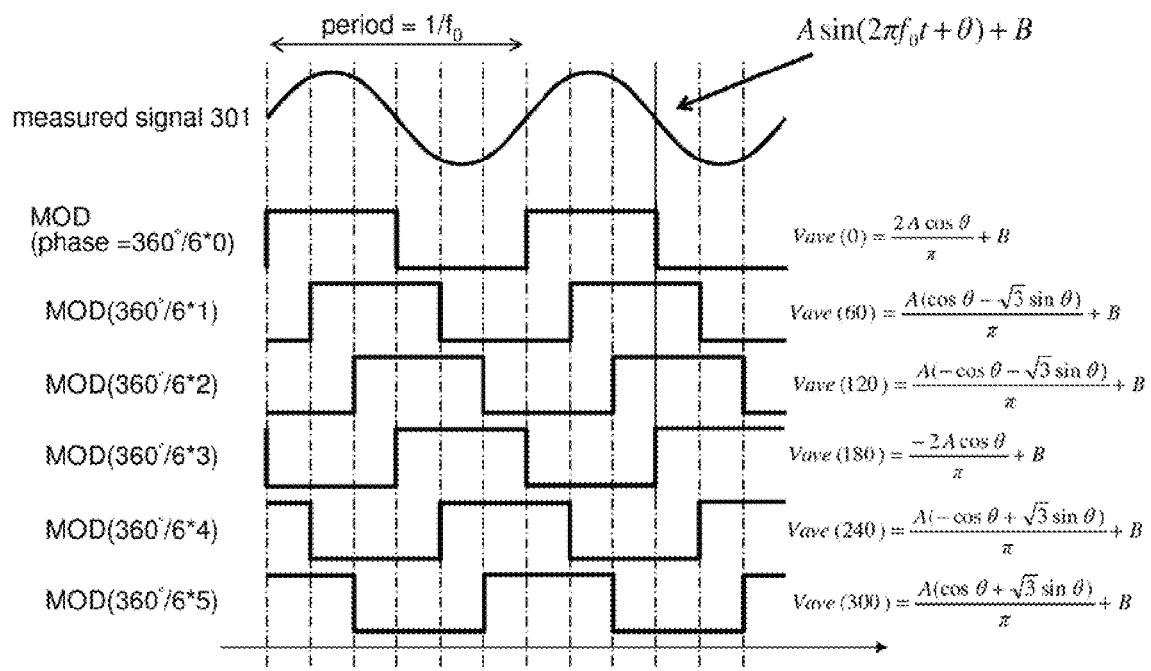
FIG. 16 is a timing chart for explaining the process of measuring the signal strength of a measured signal by using the phase-modulated signal shown in FIG. 13 in the spectrum measurement circuit according to the first exemplary embodiment of the present invention.

First, M is set to 0 in N-phase clock generation circuit 304, whereupon the phase-modulated signal MOD supplied as output from N-phase clock generation circuit 304 is a signal having the same frequency and the same phase as clock signal 302. If Vave is taken as Vave(0) at this time, Vave(0)=(2A cos θ/π)+B as shown in FIG. 16. This value is stored in memory 307.

When M is next switched to 1, phase-modulated signal MOD becomes a signal that has the same frequency as clock signal 302 but that has phase delayed by 60° from that of clock signal 302. If Vave at this time is taken as Vave(60), Vave(60)=((A(cos θ−√3 sin θ))/π)+B. This value is stored in a different location than the location in which Vave(0) is stored in memory 307.

Similarly, Vave values at the time that M is switched from 2 to 5 are taken as Vave(120), Vave(180), Vave(240), and Vave(300), respectively, these values being successively stored in memory 307. At this time, Vave(120)=((A(−cos θ−√3 sin θ))/π)+B, Vave(180)=(−2A cos θ)/π)+B, Vave(240)=((A(−cos θ+√3 sin θ))/π)+B, and Vave(300) ((A(cos θ+√3 sin θ))/π)+B.

Arithmetic unit 308 then carries out the operation of formula 2 below using Vave(0) to Vave(300) to measure the signal strength of the frequency $f_0$ component of measured signal 301, and as a result, the measurement result 309 is proportional to only amplitude A and does not depend on the values of θ or B.

$$\sqrt{\{Vave(0) - Vave(180)\}^2 + \frac{1}{3}\left\{\frac{Vave(60) + Vave(120)}{2} - \frac{Vave(240) + Vave(300)}{2}\right\}^2} = \frac{4}{\pi}A \quad \text{Formula 2}$$

The present exemplary embodiment therefore enables a solution to the problem that could not be solved when using only the measurement result of Vave when M=0. Further, the above-described problem can be solved even when not using Vave(90) and Vave(270) that were required when N=4 or N=8.

The operation of formula 2 can be carried out by, for example, a measurement device that is outside the chip. In this case, arithmetic unit 308 becomes unnecessary in the chip and the circuit configuration becomes simpler, thus enabling a further reduction of area and greater ease of circuit design.

As the second example, a case is described that enables measurement of signal strength when using four types of phase-modulated signals MOD in which the frequencies are identical but the phases randomly differ from each other, and moreover, in which the phases are already known.

Typically, when phase-modulated signal MOD, in which the frequency is $f_0$, is used to measure measured signal 301 that is a sine wave signal of $f_0$ frequency, measurement result Vave(φ) is obtained by means of the following formula 3:

$$Vave(\varphi) = \frac{-A\{F(\varphi)\cos\theta + G(\varphi)\sin\theta\}}{\pi} + B \qquad \text{Formula 3}$$

Here, φ is the phase of the MOD signal, and F(φ) and G(φ) are constants that are uniquely determined by φ. At this time, the indefinite values are A, B, cos θ, and sine, and measurement is implemented by four or more types of φ to obtain Vave. In other words, if at least four sets of Vave(φ), F(φ), and G(φ) are obtained, then A, B, cos θ, and sin θ can be found independently.

Explanation next regards operations of spectrum measurement circuit 101 when measured signal 301 is a waveform having a frequency component other than the frequency $f_0$ component.

In spectrum measurement circuit 101, measured signal 301 is passed through switch 303 that is controlled by phase-modulated signal MOD to obtain Vave. This operation is equivalent to a case in which signal 306 is the product of measured signal 301 and phase-modulated signal MOD, and the DC component of signal 306 is Vave. In other words, switch 303 operates as a mixer circuit that takes the product of measured signal 301 and phase-modulated signal MOD. When the signal strength of the frequency $f_0$ component of measured signal 301 is measured, i.e., when the frequency of clock signal 302 is set to $f_0$, a Fourier transform of phase-modulated signal MOD (pulse wave) is represented as shown in formula 4:

$$\sin(2\pi f_0 t) + \frac{\sin(3 \cdot 2\pi f_0 t)}{3} + \frac{\sin(5 \cdot 2\pi f_0 t)}{5} + \ldots \qquad \text{Formula 4}$$

Accordingly, the product of frequency $f_0$ component of measured signal 301 and the first term of formula 4 is the DC component (a value that does not fluctuate with time t) and Vave is obtained. However, when odd-multiple harmonic components $3f_0$, $5f_0$, ... of frequency $f_0$ exist in measured signal 301, the products of these harmonic components and the second term, third term, ... of formula 4 also become DC components, and these DC components are also added to the value of Vave. In other words, Vave(0) fluctuates when odd-multiple harmonic components of frequency $f_0$ are present in measured signal 301.

To summarize the above, assuming that A(f) is the signal strength of a frequency f (where f is any positive number) component of measured signal 301 and that the frequency of clock signal 302 is $f_0$, the value of Vave(0) is a result that depends on the value of f, as shown in formula 5.

$$Vave(0) = \begin{cases} \frac{2A(f)\cos\theta}{r\pi} + B & (f = rf_0, r = 1,3,5,7, \ldots) \\ 0 & (f = rf_0, r \neq 1,3,5,7, \ldots) \end{cases} \qquad \text{Formula 5}$$

One method that can be considered for solving the problem in which measurement results 309 realized by arithmetic unit 308 vary due to harmonic components, involves setting phase-modulated signal MOD a waveform that does not include $3f_0$, $5f_0$, ..., i.e., a sine wave of frequency $f_0$.

However, converting phase-modulated signal MOD to a sine wave requires a sine wave generation circuit, and providing a sine wave generation circuit in a chip increases the area and power requirement. Still further, when switch 303 is designed from MOS transistors, the current characteristics across source-drain and the gate voltage of a MOS transistor are nonlinear, and as a result, in a method in which phase-modulated signal MOD (gate voltage) is made a sine wave, nonlinear distortion occurs and the harmonic component cannot be eliminated.

However, the influence of the harmonic component is eliminated by setting phase-modulated signal MOD a composite wave of rectangular pulse waves.

Figure 17:
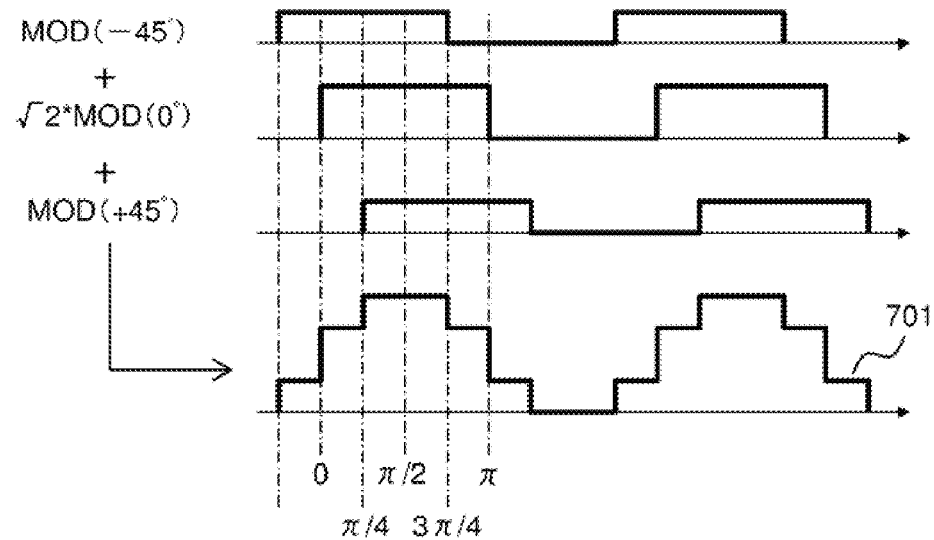
FIG. 17 is a timing chart for explaining phase-modulated signal MOD that is used when the measured signal is a waveform that includes frequency components other than the carrier frequency component in the spectrum measurement circuit according to the first exemplary embodiment of the present invention.

For example, as shown in FIG. 17, three pulse waves having the same frequency but in which phase is shifted 45° with respect to each other are prepared. A first pulse wave having an amplitude of 1 (phase −45°), a third pulse wave having an amplitude of 1 (phase +45°), and pulse wave obtained by multiplying a second pulse wave having amplitude of $\sqrt{2}$ (phase 0°) by $\sqrt{2}$ is synthesized and taken as composite wave 701. Composite wave 701 then becomes a waveform in which tertiary and quintic harmonic components are absent, as shown in formula 6.

$$(1+\sqrt{2})+(1+\sqrt{2})*\{\sin(2\pi f_0 t)+1/7*\sin(7*2\pi f_0 t)+ \\ 1/9*\sin(9*2\pi f_0 t)+\ldots\} \qquad \text{Formula 6}$$

By using this phenomenon, the influence of the tertiary and quintic harmonic components is eliminated by considering the true Vave to be the sum of: the measurement result of Vave when phase-modulated signal MOD is taken as the first pulse wave, the measurement result of Vave when the phase-modulated signal is taken as the third pulse wave, and the value obtained by multiplying by $\sqrt{2}$ the measurement result of Vave when the phase-modulated signal is taken as the second pulse wave. An example of this measurement method is explained hereinbelow.

First, the value of N of N-phase clock generation circuit 304 is set to 8, whereby the phase change when M is increased by 1 is 45°.

M is next set to 0 in N-phase clock generation circuit 304. Vave(0), which is the DC component of output signal 306 of average value output circuit 305 at this time is then stored in memory 307.

Vave(7), which is the DC component of signal 306 when M is switched to 7, and Vave(1), which is the DC component of signal 306 when M is switched to 1, are also successively stored in memory 307.

Subsequently, arithmetic unit 308 finds Vave(7)+($\sqrt{2}$*Vave(0))+Vave(1). When this measurement result 309 is taken as Vs(0), Vs(0) is expressed as shown in formula 7.

$$Vs(0) = \begin{cases} \left(1+\frac{\sqrt{2}}{2}\right) \cdot \frac{2A(f)\cos\theta}{r\pi} + \\ B+1+\frac{\sqrt{2}}{2} & (f = rf_0, r = 1 \text{ or } 7,9,11,13, \ldots) \\ 0 & (f = rf_0, r \neq 1 \text{ or } 7,9,11,13, \ldots) \end{cases} \qquad \text{Formula 7}$$

When Vs(0) of formula 7 is compared with Vave(0) of formula 5, Vs(0) is a value in which the value is not changed by the tertiary and quintic harmonic components ($3f_0$ and $5f_0$).

As a result, when a harmonic component of three times or five times frequency $f_0$ is present in measured signal 301, the problem of fluctuation of Vave(0) during measurement of the signal strength of the frequency $f_0$ component of measured signal 301 (when the frequency of clock signal 302 is set to $f_0$) can be solved.

In addition, Vs(1) is made Vave(1)+($\sqrt{2}$*Vave(2))+Vave(3), Vs(2) is made Vave(3)+($\sqrt{2}$*Vave(4))+Vave (5), Vs(3) is made Vave(5)+($\sqrt{2}$*Vave(6))+Vave (7), and arithmetic unit 308 carries out the operation of formula 8, whereupon measurement result 309 realized by arithmetic unit 308 is a result that is proportional to only A, and does not depend on the values of θ and B.

$$\sqrt{\{Vs(0)-Vs(2)\}^2 + \{Vs(1)-Vs(3)\}^2} \quad \text{Formula 8}$$

The values of θ and B can also be found when the values obtained by means of formula 8 are substituted as the values of Vs(0)-Vs(3).

In the present exemplary embodiment as described hereinabove, N-phase clock generation circuit 105 generates phase-modulated signal MOD in which the phase of clock signal 302 is shifted by (360°/N)*M, and this phase-modulated signal MOD controls the opening and closing of switch 103 of the lock-in amplifier.

In order to find the signal strength of the frequency to component of measured signal 301, the frequency of clock signal 302 is first made $f_0$. N is then fixed to 4, and measurement is carried out with Vave(0) as the average voltage Vave when M=0, Vave(1) as Vave when M=1, and so on up to Vave(N−1), and the results of these measurements stored in memory 107. The signal strength of carrier frequency $f_0$ component of measured signal 101 is then calculated in arithmetic unit 108 based on the values of memory 107. Still further, if N is fixed at 8 and if the result of multiplying average voltage Vave(7), Vave(0), and Vave(1) when M is 7, 0, and 1, respectively, by 1, $\sqrt{2}$, and 1, respectively, and of adding together the products is used, the influence of the tertiary and quintic harmonics can be eliminated from the measurement result of the signal strength of the carrier frequency $f_0$ component.

Accordingly, the influence of the phase and odd-order harmonic components of the measured signal can be eliminated from the measurement result of the signal strength of the carrier frequency $f_0$ component of measured signal 301.

In addition, the influence of the harmonic components can also be eliminated when N is equal to values other than 8.

Figure 18:
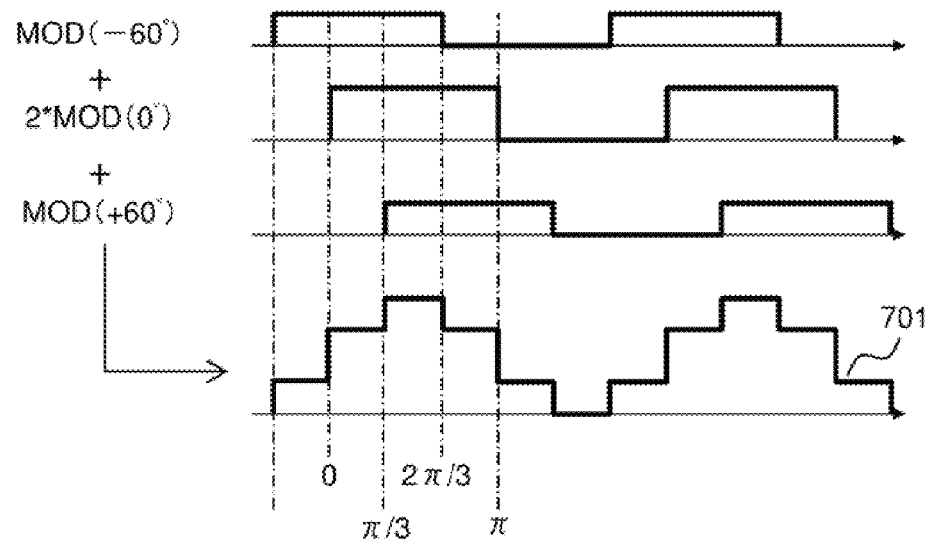
FIG. 18 is a timing chart for explaining phase-modulated signal MOD that is used when the measured signal is a waveform that includes frequency components other than the carrier frequency component in the spectrum measurement circuit according to the first exemplary embodiment of the present invention.

For example, when N is equal to 6, three pulse waves having the same frequency and phases that are shifted from each other by 60° can be prepared as shown in FIG. 18. Composite wave 701 is obtained by combining first pulse wave (phase −60°) having an amplitude of 1, third pulse wave (phase +60°) having an amplitude of 1, and a pulse wave in which second pulse wave (phase 0°) having an amplitude of 1 is multiplied by 2. Composite wave 701 is then a waveform in which tertiary harmonic component is absent, as shown by formula 9.

$$2+2*\{\sin(2\pi f_0 t)+1/5*\sin(5*2\pi f_0 t)+1/7*\sin(7*2\pi f_0 t)+\dots\} \quad \text{Formula 9}$$

Using this phenomenon, the sum of: the measurement result of Vave when the first pulse wave is taken as phase-modulated signal MOD, the measurement result of Vave when the third pulse wave is taken as phase-modulated signal MOD, and a value obtained by doubling the measurement result of Vave when the second pulse wave is taken as phase-modulated signal MOD is taken as the true Vave, whereby the influence of the tertiary harmonic component is eliminated. At this time, first pulse wave, second pulse wave, and third pulse wave are generated with 6 as the value of N of N-phase clock generation circuit 304.

When N is set to equal 6, the phase change when M is increased by 1 is 60°. If the result of measurement at the first pulse wave)(−60°) is Vave(5), the result of measurement at the second pulse wave (0°) is Vave(0), and the result of measurement at the third pulse wave (+60°) is Vave(1), arithmetic unit 308 finds Vave(5)+(2*Vave(0))+Vave(1). If this measurement result 309 is taken as Vs(0), Vs(0) is expressed as shown in formula 10.

$$Vs(0) = \begin{cases} \dfrac{6A(f)\cos\theta}{r\pi} + 4B & (f = rf_0, r = 1 \text{ or } 7,9,11,13,\dots) \\ 0 & (f = rf_0, r \neq 1 \text{ or } 7,9,11,13,\dots) \end{cases} \quad \text{Formula 10}$$

A comparison of Vs(0) of formula 10 and Vave(0) of formula 5 shows that Vs(0) is a value that does not change according to the tertiary harmonic component ($3f_0$).

As a result, when a tertiary harmonic component of 3 times frequency $f_0$ exists in measured signal 301, the problem of fluctuation of Vave(0) during measurement of the signal strength of the frequency $f_0$ component of measured signal 301 (when the frequency of clock signal 302 is set to $f_0$) can be solved.

Typically, when a composite wave is produced by combining: a first pulse wave (phase 0°) with an amplitude of 1, a pulse wave obtained by multiplying two pulse waves by S1, in which the phases are shifted +/−r° with amplitudes of 1, a pulse wave obtained by multiplying two pulse waves by S2, in which phases are shifted +/−2r° with amplitudes of 1, …, and a pulse wave obtained by multiplying two pulse waves by Sk, in which phases are shifted +/−(k×r)° with amplitudes of 1, the value of the waveform is expressed as shown in formula 11:

$$\cos(2\pi f_0 t)\left\{1 + 2S1\cos\left(2\pi \times \frac{r}{360}\right) + \right.$$
$$\left. 2S2\cos\left(2\pi \times \frac{2r}{360}\right) + \dots + 2Sk\cos\left(2\pi \times \frac{kr}{360}\right)\right\} +$$
$$\frac{1}{3}\cos(3 \cdot 2\pi f_0 t)\left\{1 + 2S1\cos\left(3 \cdot 2\pi \times \frac{r}{360}\right) + \right.$$
$$\left. 2S2\cos\left(3 \cdot 2\pi \times \frac{2r}{360}\right) + \dots + 2Sk\cos\left(3 \cdot 2\pi \times \frac{kr}{360}\right)\right\} +$$
$$\frac{1}{5}\cos(5 \cdot 2\pi f_0 t)\left\{1 + 2S1\cos\left(5 \cdot 2\pi \times \frac{r}{360}\right) + 2S2 \right.$$
$$\left. \cos\left(5 \cdot 2\pi \times \frac{2r}{360}\right) + \dots + 2Sk\cos\left(5 \cdot 2\pi \times \frac{kr}{360}\right)\right\} + \dots$$

Formula 11

Here, the first term of formula 11 is the fundamental wave component ($f_0$ component), the second term is the tertiary harmonic component ($3f_0$ component), the third term is the quintic harmonic component ($5f_0$ component), and so on. Assuming "r" is already known, in order to produce a waveform in which the tertiary harmonic component is eliminated, the set of S1, S2, …, Sk should be selected such that formula 12 is true. The reason that the first expression of formula 12 must be true is that the fundamental wave component (the $f_0$ component) becomes "0" if the left side of this expression becomes "0."

$$1 + 2S1\cos\left(2\pi \times \frac{r}{360}\right) + 2S2\cos\left(2\pi \times \frac{2r}{360}\right) + \dots + 2Sk\cos\left(2\pi \times \frac{kr}{360}\right) \neq 0 \quad \text{Formula 12}$$

-continued $$1 + 2S1\cos\left(3 \cdot 2\pi \times \frac{r}{360}\right) + 2S2\cos\left(3 \cdot 2\pi \times \frac{2r}{360}\right) + \ldots +$$

$$2Sk\cos\left(3 \cdot 2\pi \times \frac{kr}{360}\right) = 0$$

In this way, simultaneous equations with p unknowns and the first term of formula 12 such that the coefficient of the $m^{th}$ harmonic component of formula 11 is "0" are shown for eliminating any number "p" of harmonic components among typical $m^{th}$-order harmonic components (where m=3, 4, 7, ... ). The set S1, S2, Sk is set as the solution (k=p, but when simultaneous equations with p unknowns can be solved with k<p, k can be smaller than p). The influence of a desired harmonic component can then be eliminated by regarding the true Vave as the sum of the measurement result of Vave when the first pulse wave (phase 0°) with amplitude of 1 is taken as phase-modulated signal MOD and values obtained by multiplying, by Sx (where x is 1, 2, 3, ... ), the measurement results of Vave when pulse waves in which the phase is shifted are taken as the phase-modulated signals MOD. A measurement result Vs in which desired $m^{th}$-order harmonic component has been eliminated is thus obtained by increasing the number of pulse waves, by finding a coefficient such that the composite wave eliminates desired odd-order harmonic components, and then by multiplying Vave measured using each of the pulse waves by the coefficient and adding the results.

In the present exemplary embodiment, DC voltage is applied to first and second terminals X1 and X2 in waveform attenuator 104 and the current value at this time is then read from outside the chip, whereby resistance values R1-R3 of resistors 201-203 that make up waveform attenuator 104 can be measured with high accuracy. In addition, the signal strength of measured signal 301 that is measured by means of spectrum measurement circuit 101 can be read from outside the chip.

Accordingly, the strength of the input signal of RF receiver 103 and the characteristics of waveform attenuator 104 can be measured by a measurement device such as a highly accurate and low-cost off-chip digital tester.

Second Exemplary Embodiment

The overall configuration of the signal quality measurement device of the present exemplary embodiment is similar to the configuration shown in FIG. 10, but the configuration of spectrum measurement circuit 101 differs from the circuit shown in FIG. 12.

Figure 19:
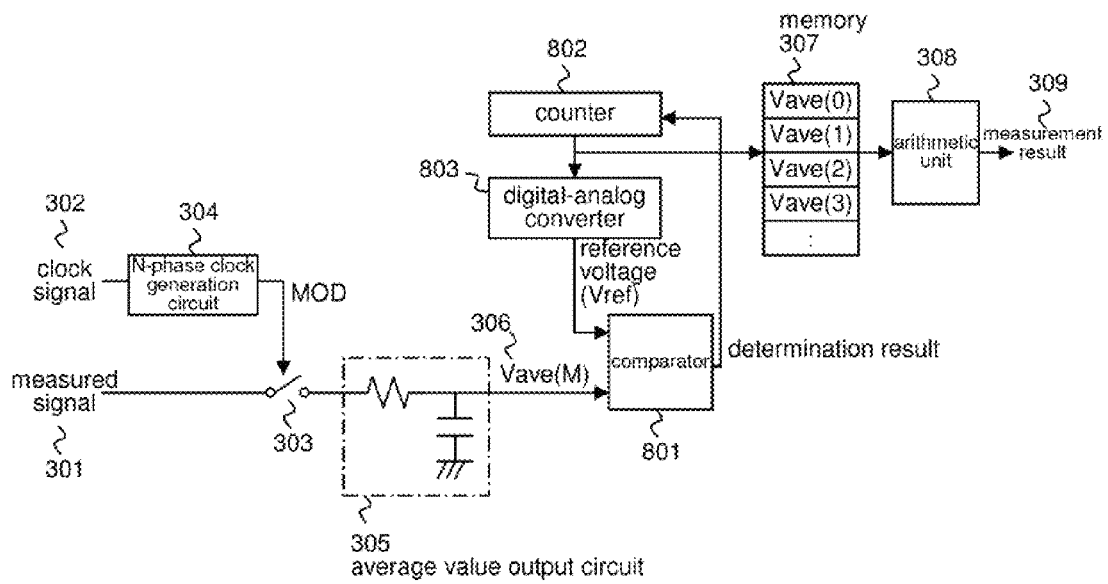
FIG. 19 is a block diagram showing the configuration of the spectrum measurement circuit according to the second exemplary embodiment of the present invention.

FIG. 19 is a block diagram showing the configuration of spectrum measurement circuit 101 according to the second exemplary embodiment of the present invention.

As shown in FIG. 19, compared with the configuration shown in FIG. 12, spectrum measurement circuit 101 according to the present exemplary embodiment differs by being provided with: comparator 801 for determining the sizes of average voltage Vave of output signal 306 of average value output circuit 305 and reference voltage Vref to be explained hereinbelow; counter 802 for increasing or decreasing a counter value in accordance with the determination result of comparator 801; and digital-analog converter (DA converter) 803 for supplying comparator 801 with reference voltage Vref according to the counter value by converting the counter value of counter 802 from a digital signal to an analog signal.

The operations of spectrum measurement circuit 101 according to the present exemplary embodiment are next described.

When voltage Vave of signal 306 that is supplied as output from average value output circuit 305 is lower than reference voltage Vref, the output of the comparator becomes low level, whereupon counter 802 increments the counter value by "1" and reference voltage Vref is boosted, following which comparison is carried out again in comparator 801. On the other hand, when Vave is higher, the output of comparator 801 becomes high level, whereupon counter 802 decrements the counter value by "1" and reference voltage Vref is lowered, following which comparison is carried out again in comparator 801.

By repeating the above-described operations, a counter value is sought such that Vave and reference voltage Vref become equal, and the counter value that was found is stored as Vave in memory 307.

Vave can thus be stored in memory 307 as a digital signal and analog DC voltages are eliminated from within spectrum measurement circuit 101, whereby measurement result 309 can be easily supplied.

Since the counter value that becomes Vave does not vary with time, the present exemplary embodiment has the advantage that the measurement of reference voltage Vref may employ as digital-analog converter 803 a pipeline DA converter that, although slow, has a small area.

Third Exemplary Embodiment

Although the overall configuration of the signal quality measurement device of the present exemplary embodiment is similar to that of FIG. 10, the configuration of spectrum measurement circuit 101 differs from the configuration shown in FIG. 12.

When measuring the signal strength of the frequency $f_0$ component of measured signal 301, the carrier generation clock of frequency $f_0$ that is used in RF transmitter 102 as clock signal 302 may be applied directly to spectrum measurement circuit 101.

Because the carrier generation clock that is used in RF transmitter 102 is typically generated in a phase-locked loop (PLL) circuit (not shown) on the chip, a high-speed signal need not be applied as input from outside the chip.

However, in order to measure the harmonic component of measured signal 301, i.e., the signal strength of the $K^*f_0$ (where K=2, 3, and can be set from the outside) frequency component, a clock that is a multiple of K of the carrier generation clock is required as clock signal 302. However, applying the clock of a harmonic that is a K-multiple of the carrier frequency (1 GHz or more) $f_0$ as input from the outside necessitates a tester compatible with high-speed I/O design or a high-speed clock and thus entails an increase in device costs.

Figure 20:
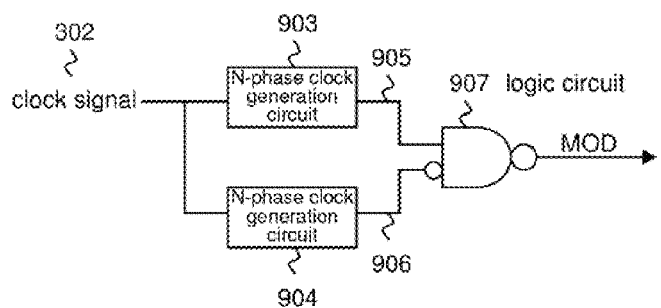
FIG. 20 is a block diagram showing a portion of the spectrum measurement circuit according to the third exemplary embodiment of the present invention.

In this regard, a method of measuring the signal strength of a K-order harmonic component using only the carrier signal (frequency $f_0$) as clock signal 302 is next described using FIG. 20.

FIG. 20 is a block diagram showing a portion of the configuration of spectrum measurement circuit 101 according to the third exemplary embodiment of the present invention.

As shown in FIG. 20, spectrum measurement circuit 101 according to the present exemplary embodiment differs from the configuration shown in FIG. 12 in that first and second N-phase clock generation circuits 903 and 904 and logic circuit 907 are provided as N-phase clock generation circuit 304.

In the measurement of signal strength of the K-order harmonic component, first N-phase clock generation circuit 903 supplies as output neutral signals 905 obtained by shifting clock signal 302 by a phase modulation amount (360°/K * J)*(M/N) {where J=0, 1, ..., (K−1), and J can be set from the outside}. In addition, second N-phase clock generation circuit 904 supplies neutral signals 906 obtained by shifting clock signal 302 by a phase modulation amount (360°/K*J) *(M/N)+(180°/K). Logic circuit 907 then calculates the NAND of the value of neutral signals 905 and the inverse value of neutral signals 906 and takes the result of this calculation as phase-modulated signal MOD.

Figure 21:
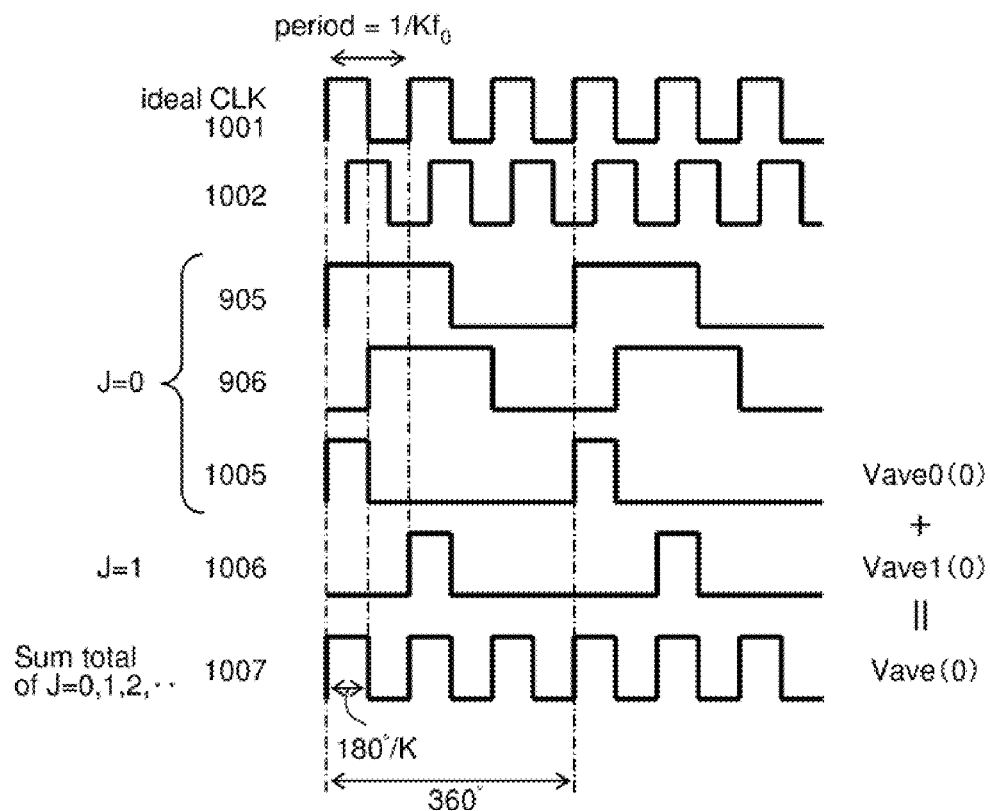
FIG. 21 is a timing chart for explaining the basic operations of the spectrum measurement circuit according to the third exemplary embodiment of the present invention.

The above operations are next described in detail using the timing chart of FIG. 21.

In order to measure the signal strength of an ideal K-order harmonic component, waveforms 1001, 1002, . . . of the phase-modulated signal MOD of frequency $K*f_0$ shown in FIG. 19 are used to measure Vave(0), Vave(1), . . . . These values Vave(0), Vave(1), . . . are measured by using the circuit shown in FIG. 20, i.e., by using only the carrier signal (frequency $f_0$) as clock signal 302. N is fixed to any number.

First, when J is set to 0 and M is set to 0, the phase of neutral signal 905 is 0 and the phase of neutral signal 906 is (180°/K). As a result, the operation result of logic circuit 907 is waveform 1005 shown in FIG. 21. When this waveform 1005 is taken as phase-modulated signal MOD, the measurement result of average value output circuit 305 is Vave0(0).

When J is next set to 1 and M is set to 0, the phase of neutral signal 905 becomes (360°/K) and the phase of neutral signal 906 becomes (360°/K+180°). As a result, the operation result of logic circuit 907 becomes waveform 1006 shown in FIG. 21. When this waveform 1006 is made phase-modulated signal MOD, the measurement result of average value output circuit 305 is Vave1(0).

The measurement results Vave2(0), VaveK−1(0) of average value output circuit 305 are obtained by repeating the above-described operations from J=2, 3, . . . , (K−1).

Taking the sum of waveforms 1005, 1006, . . . results in waveform 1007 shown in FIG. 21, which is identical to waveform 1001.

Accordingly, Vave0(0)+Vave1(0), ++VaveK−1(0) is equal to Vave(0).

Vave(1), Vave(2) Vave(N−1) are obtained by means of the same process for M=1, 2, . . . , (N−1).

By means of the above method, the signal strength of the K-order harmonic component of measured signal 301 can be measured by using only carrier signal (frequency $f_0$) as clock signal 302.

Fourth Exemplary Embodiment

Figure 22:
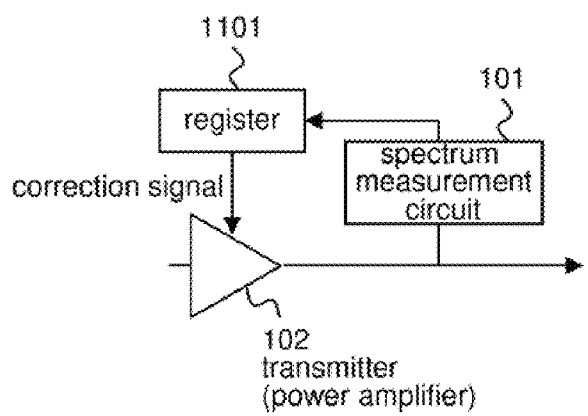
FIG. 22 is a block diagram showing a portion of the configuration of the signal quality measurement device of the fourth exemplary embodiment of the present invention.

FIG. 22 is a block diagram showing a portion of the configuration of the signal quality measurement device of the fourth exemplary embodiment of the present invention.

As shown in FIG. 22, the signal quality measurement device of the present exemplary embodiment differs from the configuration shown in FIG. 10 in that register 1101 is provided.

RF transmitter 102 is assumed to be a power amplifier capable of correcting the strength of the carrier frequency component and harmonic component in accordance with a correction signal that is a digital signal.

Register 1101 temporarily holds a DC voltage value that is measurement result 309 of the spectrum measurement circuit and supplies a correction signal corresponding to the DC voltage value to the RF transmitter 102.

Thus, when the strength of the carrier frequency component of the output signal of RF transmitter 102 is insufficient or when the strength of the harmonic component exceeds a prescribed value, the strengths of the carrier frequency component and harmonic component of RF transmitter 102 can be corrected to useable products, thereby enabling an increase in chip yield.

The operations of above-described spectrum measurement circuit 101 can obviously be configured such that the operation procedures are stored in advance as a program on a recording medium such as ROM, following which the program is read and executed by a computer.

Although the invention of the present application has been described with reference to exemplary embodiments, the invention of the present application is not limited to the above-described exemplary embodiments. The configuration and details of the invention of the present application is open to various modifications within the scope of the invention of the present application that will be readily understood by anyone skilled in the art.

The invention claimed is:

1. A signal quality measurement device that includes a transmitter and a receiver that are objects of testing; a waveform attenuator for, after having attenuated a measured signal supplied as output from said transmitter, applying said measured signal as input to said receiver; and a spectrum measurement circuit for measuring the signal strength of said measured signal that was supplied as output from said transmitter; said spectrum measurement circuit comprising:

an N-(where N is an integer equal to or greater than 4) phase clock generation circuit for supplying phase-modulated signals obtained by shifting the phase of a clock signal by a phase modulation amount each time the settings of the phase modulation amount are switched;

a mixer circuit for taking the products of said measured signal that was supplied from said transmitter and said phase-modulated signals supplied from said N-phase clock generation circuit;

an average value output circuit for supplying an average voltage value of the output signal of said mixer circuit;

a memory for storing said average voltage value supplied from said average value output circuit for each said phase modulation amount of said N-phase clock generation circuit;

an arithmetic unit for using said average voltage value for each said phase modulation amount of said N-phase clock generation circuit stored in said memory to calculate signal strength of said measured signal;

a comparator for determining the sizes of said average voltage value that is supplied from said average value output circuit and a reference voltage value;

a counter for increasing or decreasing a counter value in accordance with the determination result realized by said comparator; and a digital-analog converter for converting the counter value of said counter from a digital value to an analog value and supplying to said comparator said reference voltage value that accords with the converted analog value, wherein said N-phase clock generation circuit, in the measurement of the signal strength of the carrier frequency component of said measured signal, supplies said phase-modulated signals whose phases differ from each other, whose frequency is identical, and further, the values of the phases of each are known, and wherein said memory stores, as said average voltage value, the counter value of said counter at the time that said average voltage value supplied from said average value output circuit and said reference voltage value become equal.

2. The signal quality measurement device according to claim 1, wherein the frequency of said N-phase clock is identical to the frequency of the frequency component that is to be measured or (1/m)th (where m is an integer) the frequency of the frequency component that is to be measured.

3. The signal quality measurement device according to claim 1, wherein said mixer circuit is a switch that opens and closes in accordance with said phase-modulated signal supplied from said N-phase clock generation circuit and that passes and supplies said measured signal that was supplied from said transmitter when in a closed state.

4. The signal quality measurement device according to claim 1, wherein said N-phase clock generation circuit, in the measurement of signal strength of the carrier frequency component of said measured signal, sets said phase modulation amount (360°/N)*M (where M is an integer equal to or greater than 0 but no greater than N−1), the value of N being fixed and the value of M being switched with each switching of the settings of said phase modulation amount.

5. The signal quality measurement device according to claim 1, wherein the value of N is fixed at 4 in said N-phase clock generation circuit.

6. The signal quality measurement device according to claim 1, wherein the value of N is fixed at 8 in said N-phase clock generation circuit.

7. The signal quality measurement device according to claim 1, wherein said N-phase clock generation circuit comprises:
a first N-phase clock generation circuit for, in the measurement of the signal strength of a K-(where K is an integer equal to or greater than 2) order harmonic component of said measured signal, setting said phase modulation amount (360°/(K*J))*(M/N) (where J is an integer equal to or greater than 0 but not exceeding K−1), the value of N being fixed and the values of J and M being switched when the settings of said phase modulation amount are switched;
a second N-phase clock generation circuit for, in the measurement of the signal strength of a K-order harmonic component of said measured signal, setting said phase modulation amount (360°/(K*J))*(M/N)+(180°/K), the value of N being fixed and the values of J and M being switched when the settings of said phase modulation amount are switched; and
a logic circuit for calculating the NAND of the voltage value of the output signal of said first N-phase clock generation circuit and the inverted voltage value of the output signal of said second N-phase clock generation circuit, and supplying the calculation result as said phase-modulated signal.

8. The signal quality measurement device according to claim 1, wherein said waveform attenuator comprises:
first and second terminals to which voltage is applied from the outside;
a first resistor having one end connected to said first terminal;
a second resistor having one end connected to said second terminal and the other end connected to the other end of said first resistor; and
a third resistor having one end connected to a connection node of said first and second resistors and the other end grounded.

9. A spectrum measurement circuit for measuring signal strength of a measured signal, said spectrum measurement circuit comprising:
an N-(where N is an integer equal to or greater than 4) phase clock generation circuit for supplying phase-modulated signals in which the phase of a clock signal has been shifted by a phase modulation amount each time the setting of the phase modulation amount is switched;
a mixer circuit for taking the products of said measured signal and said phase-modulated signals that are supplied from said N-phase clock generation circuit;
an average value output circuit for supplying an average voltage value of the output signal of said mixer circuit;
a memory for storing said average voltage value that is supplied from said average value output circuit for each said phase modulation amount of said N-phase clock generation circuit;
an arithmetic unit for calculating signal strength of said measured signal using said average voltage value that is stored in said memory for each said phase modulation amount of said N-phase clock generation circuit;
a comparator for determining the sizes of said average voltage value supplied from said average value output circuit and a reference voltage value;
a counter for increasing or decreasing a counter value in accordance with the determination result realized by said comparator; and
a digital-analog converter for converting the counter value of said counter from a digital value to an analog value and supplying said comparator with said reference voltage value that accords with the converted analog value,
wherein said memory stores, as said average voltage value, the counter value of said counter at the time that said average voltage value that was supplied from said average value output circuit and said reference voltage value become equal, and
wherein said N-phase clock generation circuit, in the measurement of the signal strength of the carrier frequency component of said measured signal, supplies said phase-modulated signals whose phases differ from each other, whose frequencies are identical, and moreover, the values the phase of each are known.

10. The spectrum measurement circuit according to claim 9, wherein the frequency of said N-phase clock is identical to the frequency of the frequency component that is to be measured or (1/m)th (where m is an integer) of the frequency of the frequency component that is to be measured.

11. The spectrum measurement circuit according to claim 9, wherein said mixer circuit is a switch that opens and closes in accordance with said phase-modulated signal that was supplied from said N-phase clock generation circuit and that passes and supplies said measured signal in the closed state.

12. The spectrum measurement circuit according to claim 9, wherein said N-phase clock generation circuit, in the measurement of the signal strength of the carrier frequency component of said measured signal, sets said phase modulation amount (360°/N)*(M) (where M is an integer equal to or greater than 0 but no greater than N−1), the value of N being fixed and the value of M being switched when the settings of said phase modulation amount are switched.

13. The spectrum measurement circuit according to claim 9, wherein the value of N is fixed at 4 in said N-phase clock generation circuit.

14. The spectrum measurement circuit according to claim 9, wherein the value of N is fixed at 8 in said N-phase clock generation circuit.

15. The spectrum measurement circuit according to claim 9, wherein said N-phase clock generation circuit comprises:
a first N-phase clock generation circuit for, in the measurement of the signal strength of a K-(where K is an integer equal to or greater than 2) order harmonic component of said measured signal, setting said phase modulation amount (360°/(K*J))*(M/N) (where J is an integer equal to or greater than 0 but not exceeding K−1), the value of N being fixed and the values of J and M being switched when the settings of said phase modulation amount are switched;
a second N-phase clock generation circuit for, in the measurement of the signal strength of a K-order harmonic component of said measured signal, setting said phase modulation amount (360°/(K*J))*(M/N)+(180°/K), the value of N being fixed and the values of J and M being switched when the settings of said phase modulation amount are switched; and a logic circuit for calculating the NAND of the voltage value of the output signal of said first N-phase clock generation circuit and the inverted voltage value of the output signal of said second N-phase clock generation circuit, and supplying the calculation result as said phase-modulated signal.

\* \* \* \* \*